(12) United States Patent
Bjoerk et al.

(10) Patent No.: US 8,288,803 B2
(45) Date of Patent: Oct. 16, 2012

(54) TUNNEL FIELD EFFECT DEVICES

(75) Inventors: Mikael T. Bjoerk, Rueschlikon (CH);
Siegfried F. Karg, Rueschlikon (CH);
Joachim Knoch, Obfelden (CH); Heike E. Riel, Rueschlikon (CH); Walter H. Riess, Rueschlikon (CH); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 12/550,857

(22) Filed: Aug. 31, 2009

(65) Prior Publication Data

US 2011/0049474 A1    Mar. 3, 2011

(51) Int. Cl.
*H01L 29/76* (2006.01)

(52) U.S. Cl. ............ 257/288; 257/344; 257/E29.262; 257/408; 257/409; 257/410; 257/411

(58) Field of Classification Search ............ 257/288, 257/344, 347, 408–411, E29.262
See application file for complete search history.

(56) References Cited

U.S. PATENT DOCUMENTS

| 7,112,478 B2 | 9/2006 | Grupp et al. |
| 7,465,976 B2 | 12/2008 | Kavalieros et al. |
| 2005/0274992 A1 | 12/2005 | Appenzeller et al. |
| 2008/0067495 A1 | 3/2008 | Verhulst |
| 2009/0034355 A1 | 2/2009 | Wang |

OTHER PUBLICATIONS

Q. Zhang et al.; "Can the Interband Tunnel FET Outperform Si CMOS?", Device Research Conference, Jun. 2008, Santa Barbara, CA.
J. Knoch et al.; "A novel concept for field-effect transistors—the tunneling carbon nanotube FET;" DRC 2005; Conference Digest, p. 153-156 (2005).
Jknoch et al.; "Transport in heterostructure nanowire tunneling FETs;" ICON 2007.
Q. Zhang et al.; "Fully-depleted Ge interband tunnel trasistor: Modeling and junction formation;" Solid-State Electronics 53 (2009) 30-35.
Imec Tunnel FETs, [online]; [retrieved on Apr. 16, 2009]; retrieved from the Internet http://www.imec.be/wwwinter/mediacenter/en/SR2007/html/1384090.html.
Y M Lin, et al., "High-Performance Carbon Nanotube Field-Effect Transistor With Tunable Polarities," IEEE Trans. Nanotechnol.,vol. 4, No. 5; pp. 481-489; Sep. 2005.

*Primary Examiner* — Samuel Gebremariam
(74) *Attorney, Agent, or Firm* — Cantor Colburn LLP; Daniel Morris

(57) ABSTRACT

An indirectly induced tunnel emitter for a tunneling field effect transistor (TFET) structure includes an outer sheath that at least partially surrounds an elongated core element, the elongated core element formed from a first semiconductor material; an insulator layer disposed between the outer sheath and the core element; the outer sheath disposed at a location corresponding to a source region of the TFET structure; and a source contact that shorts the outer sheath to the core element; wherein the outer sheath is configured to introduce a carrier concentration in the source region of the core element sufficient for tunneling into a channel region of the TFET structure during an on state.

28 Claims, 6 Drawing Sheets

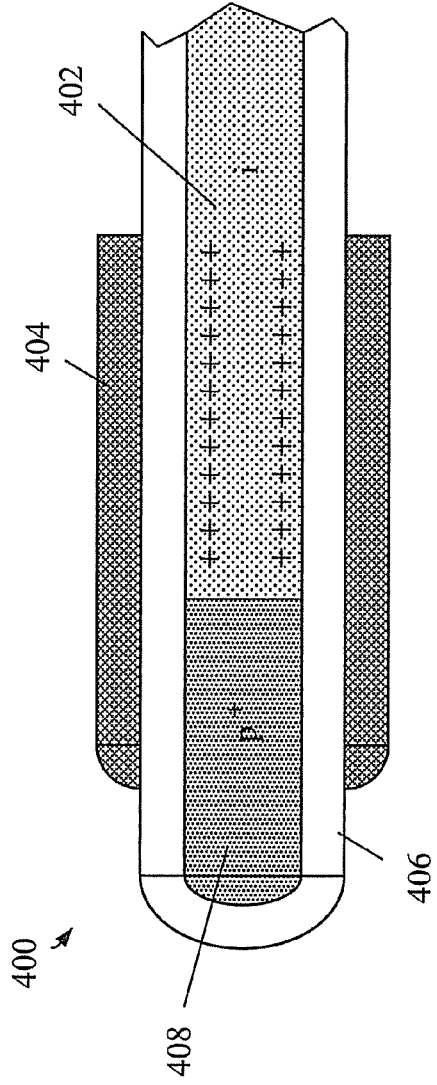
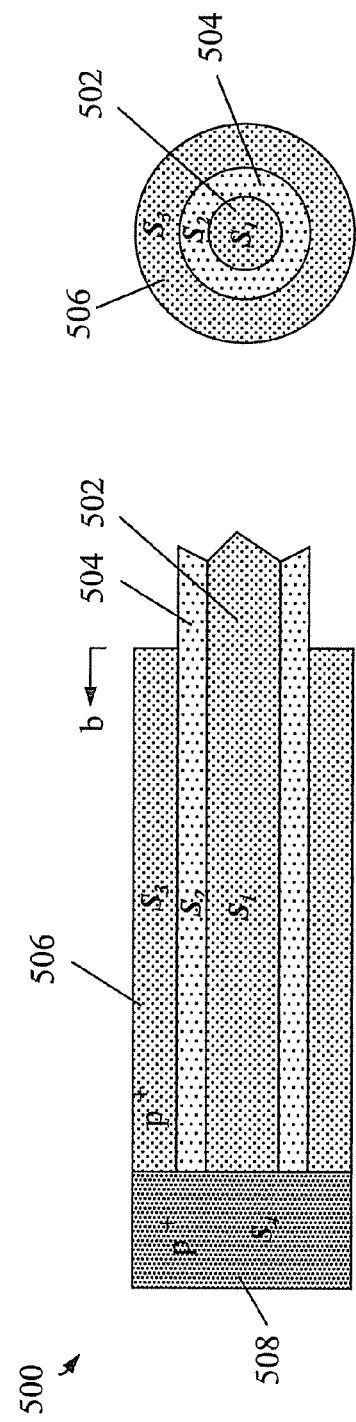
Fig. 4
Fig. 5(a)
Fig. 5(b)

US 8,288,803 B2

TUNNEL FIELD EFFECT DEVICES

BACKGROUND

The present invention relates generally to semiconductor device structures and, more particularly, to an indirectly induced tunnel emitter for tunnel field effect transistor (TFET) devices.

Microelectronic devices are typically fabricated on semiconductor substrates as integrated circuits, which include complementary metal oxide semiconductor (CMOS) field effect transistors as one of the core elements thereof Over the years, the dimensions and operating voltages of CMOS transistors are continuously reduced, or scaled down, to obtain ever-higher performance and packaging density of the integrated circuits.

However, one of the problems resulting from the scaling down of CMOS transistors is that the overall power consumption of the devices keeps increasing. This is partly because leakage currents are increasing (e.g., due to short channel effects) and also because it becomes difficult to continue to decrease the supply voltage. The latter problem, in turn, is mainly due to the fact that the inverse subthreshold slope is limited to (minimally) about 60 millivolts (mV)/decade, such that switching the transistor from the OFF to the ON states requires a certain voltage variation, and therefore a minimum supply voltage.

Accordingly, tunnel field effect transistors (TFETs) have been touted as "successors" of metal oxide semiconductor field effect transistors (MOSFETs), because of the lack of short-channel effects and because the subthreshold slope can be less than 60 mV/decade, the physical limit of conventional MOSFETs, and thus potentially lower supply voltages may be used. On the other hand, TFETs typically suffer from low on-currents, which is a drawback related to the large resistance of the tunnel barrier.

SUMMARY

In an exemplary embodiment, an indirectly induced tunnel emitter for a tunneling field effect transistor (TFET) structure includes an outer sheath that at least partially surrounds an elongated core element, the elongated core element formed from a first semiconductor material; an insulator layer disposed between the outer sheath and the core element; the outer sheath disposed at a location corresponding to a source region of the TFET structure; and a source contact that shorts the outer sheath to the core element; wherein the outer sheath is configured to introduce a carrier concentration in the source region of the core element sufficient for tunneling into a channel region of the TFET structure during an on state.

In another embodiment, a method of forming an indirectly induced tunnel emitter for a tunneling field effect transistor (TFET) structure includes forming an elongated core element from a first semiconductor material; forming an insulator layer that at least partially surrounds the core element; forming an outer sheath that at least partially surrounds the insulator layer at a location corresponding to a source region of the TFET structure; and forming a source contact that shorts the outer sheath to the core element; wherein the outer sheath is configured to introduce a carrier concentration in the source region of the core element sufficient for tunneling into a channel region of the TFET structure during an on state.

BRIEF DESCRIPTION OF THE SEVERAL VIEWS OF THE DRAWINGS

Referring to the exemplary drawings wherein like elements are numbered alike in the several Figures:

FIG. 4 is a cut-away sectional view of a source region of a TFET device wherein holes are induced in a nanowire by a surrounding metal sheath that is separated from the nanowire by a thin insulator layer; and FIG. 5($a$) is a side cross-sectional views of a TFET structure having an Indirectly Induced Tunnel Emitter (IITE), in accordance with an exemplary embodiment of the invention;

FIG. 5($b$) is an end cross-sectional view of the IITE, taken along the lines b-b of FIG. 5($a$);

FIG. 7($b$) is a band diagram corresponding to the structure of FIG. 7($a$)

DETAILED DESCRIPTION

Figure 1:
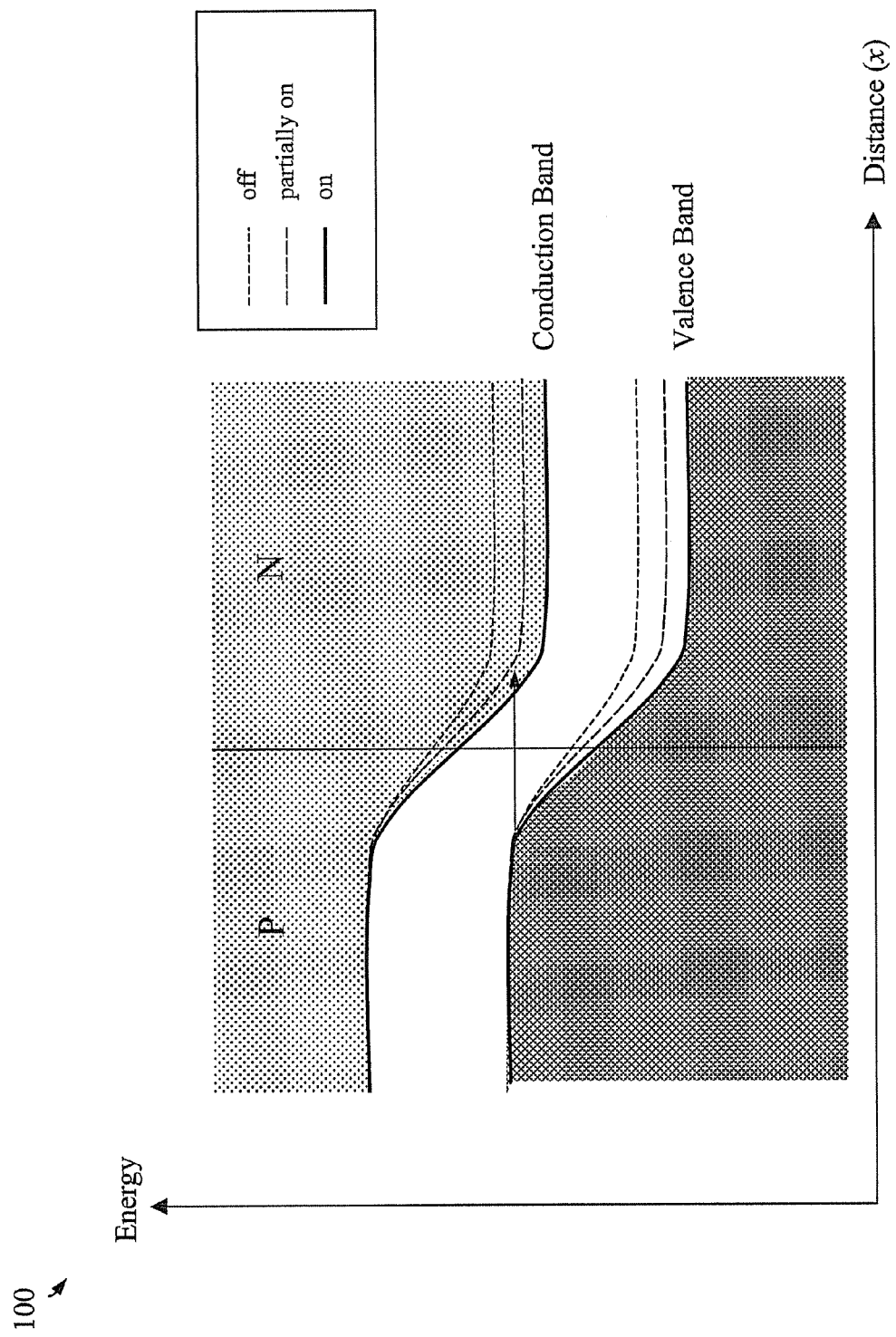
FIG. 1 is a band diagram that illustrates electron tunneling across a P/N junction of a TFET.

As indicated above, in recent years the TFET has generated much interest as a possible candidate used for low power electronics. Typically, in an n-channel TFET for example, electrons are injected from the top of the valence band in the source region of the device into the bottom of the conduction band in the channel of the device. FIG. 1 is a band diagram that illustrates this process for a simple P/N junction, wherein the "P" side represents the source region and the "N" side represents the channel of a TFET. In the "on" state (as indicated by the darkened curves denoting the bands) electrons can tunnel from the valence band in the source to the conduction band in the channel. Applying an increasing negative gate voltage to a "partially on" state causes the tunneling distance to increase (indicated by the large dashed curves), and eventually the bands become uncrossed (indicated by the short dashed curves) shutting off the current.

Figure 3:
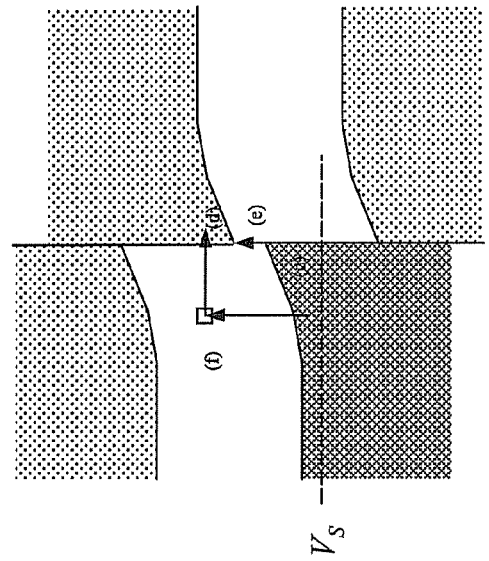
FIG. 3 is a band diagram for a TFET device having a staggered band heterojunction in the "off" state.
Figure 2:
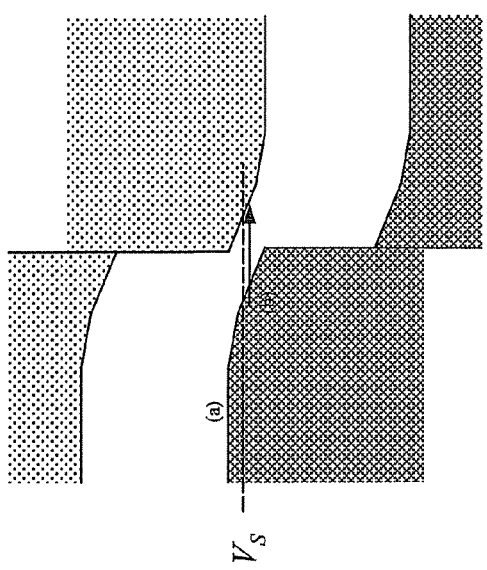
FIG. 2 is a band diagram for a TFET device having a staggered band heterojunction in the "on" state.

One type of junction arrangement for a TFET device is what is known as a staggered band heterojunction line up, illustrated in the band diagrams of FIGS. 2 and 3. In this arrangement, the energy bands in the source and channel regions are offset from one another so as to allowing switching from the "on" state in FIG. 2 to the "off" state in FIG. 3 with much smaller longitudinal electric fields.

A primary objective of TFET use is to achieve switching from "on" to "off" over a much smaller voltage range than a conventional FET. This is realized because a conventional n-type source used in an NFET is replaced by a p-type tunneling source (also referred to herein as an "emitter") where the top of the valence band cuts off the thermal tail of the Fermi function, which is present in the n-type source, allowing for an inverse sub-threshold slope S of smaller than 60 mV/dec at room temperature, where $S=[d(\log_{10} I_D)/dV_G]^{-1}$, wherein $I_D$ is the drain current and $V_G$ is the gate voltage.

On the other hand, the band diagrams of FIGS. 2 and 3 also illustrate several factors that serve to increase S and degrade the performance of the TFET. For example, in the "on" state depicted in FIG. 2, degeneracy in the source (region (a) in FIG. 2) reduces the states available for tunneling, thereby reducing the "on" current. In addition, band bending (region (b) in FIG. 2) increases the gate voltage needed to turn on the TFET. In the "off" state depicted in FIG. 3, band bending (regions (c) and (d) in FIG. 3) increases the voltage swing required to turn off the TFET and leaves potential wells in the valence and conduction bands. Here, thermal tails can cause a reversion to the 60 mV/decade slope when tunneling from the wells, band-to-band transfer by multiphonon processes (region (e) of FIG. 3), or band-to-band transfer via tunneling by gap states (region (f) of FIG. 3).

Although the presence of a high dopant concentration in the source could reduce such band bending, the resulting disorder caused by the doping can induce gap states, and the high carrier concentration could in turn lead to excessive degeneracy. Thus, one possible solution to this problem is to use "electrostatic doping", as illustrated in FIG. 4. More specifically, FIG. 4 is a cut-away sectional view of a source region of a TFET device 400 where, in this example, holes are induced in a nanowire 402 by way of a surrounding metal sheath 404 that is separated from the nanowire 402 by a thin insulator layer 406, similar to a gate conductor and gate dielectric layer of an FET. The proximity to the surrounding metal sheath 404 screens the electric field inside the nanowire 402, thus obviating the need for a large hole concentration in the nanowire itself Here, a heavily doped section 408 of the nanowire 402, remote from the tunnel injector (not shown in FIG. 4), provides electrical contact to the TFET. While this solution solves some of the problems outlined above, it also creates others. For example, the TFET 400 of FIG. 4 would need a separate electrical contact for the metal sheath 404, complicating the design. In addition, the interface states at the insulator-nanowire boundary may provide additional tunneling paths, and metal-induced gap states may be induced by the close proximity of the sheath 404 to the channel.

Accordingly, FIGS. 5(a) and 5(b) are side and end cross-sectional views, respectively, of a TFET structure 500 having what is referred to herein as an Indirectly Induced Tunnel Emitter (IITE), in accordance with an exemplary embodiment of the invention. As is shown, the IITE includes a elongated core element 502 (e.g., a nanowire) formed from a first semiconductor material (S1), an insulator layer 504 formed from a second semiconductor material (S2) that surrounds the nanowire, the second semiconductor material (S2) having a wider bandgap than the first semiconductor material (S1), a doped outer semiconductor sheath 506 formed from a third semiconductor material (S3) that surrounds the insulator 504, and a source contact 508 formed from a fourth semiconductor material (S4) that shorts the outer semiconductor sheath 506 to the core element 502.

In an exemplary embodiment, the materials used for semiconductors S1-S4 could all be epitaxially grown semiconductors forming heterojunctions at their interfaces. This could reduce or eliminate interface states, which represent a problem for TFET structures such as the one shown in FIG. 4. Because the outer sheath 506 is also a doped semiconductor (S3), metal induced gap states (MIGS) are also eliminated. Further, the TFET structure shown in FIGS. 5(a) and 5(b) may be simplified by using the same semiconductor material for S1, S3 and S4.

Although the exemplary embodiment depicted illustrates a concentric circular configuration for the core element, insulator and outer sheath, it is contemplated that other suitable geometries may be used. For example, the cross-sectional shapes of the individual element may be other shapes besides circular, such as elliptical, oval, square or rectangular, for example. Furthermore, while the illustrated embodiment depicts layers completely surrounding other layers (e.g., the insulator layer 504 surrounding the core element 502), it is also contemplated that an outer layer of the structure can partially surround an inner layer of the structure, such as an omega ($\Omega$) shape, for example.

With respect to the elongated core element 502, in addition to a nanowire structure element, the core element 502 could also be formed from other structures such as a semiconductor fin or a carbon nanotube, for example.

Figure 6:
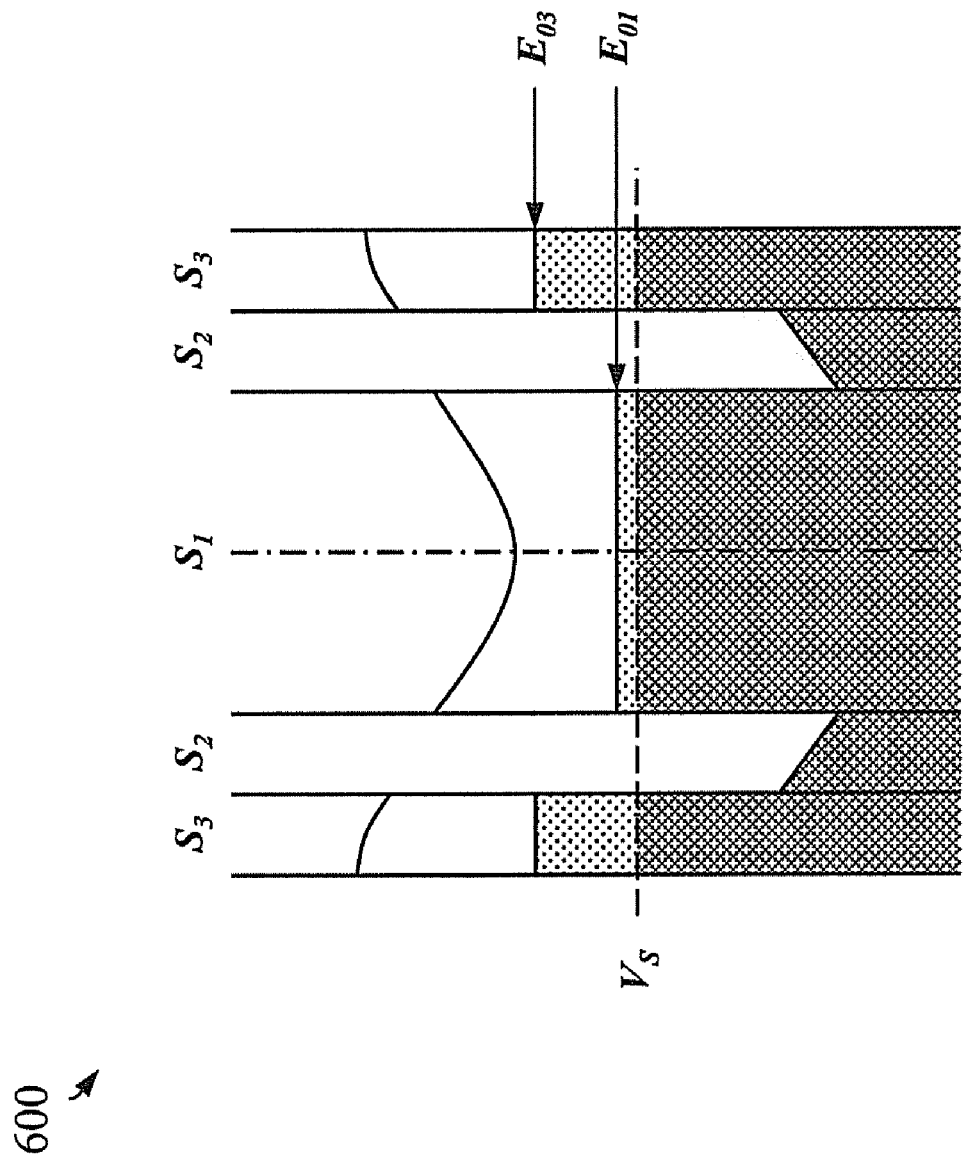
FIG. 6 is a partial band diagram illustrating the valence bands for an exemplary n-channel TFET as shown in FIGS. 5($a$) and 5($b$)

Referring now to FIG. 6, there is shown a partial band diagram 600 illustrating the valence bands for an exemplary n-channel TFET as shown in FIGS. 5(a) and 5(b), cutting across the circular cross section. As is shown, $E_{01}$ and $E_{03}$ are the ground state sub-band energies in regions 1 and 3, respectively, and $V_S$ is the Fermi energy (source voltage). The bandgaps of S1-S3 are assumed to be wide enough so that the conduction bands in the emitter do not play a role in its operation. The band alignments and thickness of the layers are adjusted to achieve a configuration such that the ground-state energies $E_{01}$ and $E_{03}$ ensure that the holes in S1 are barely degenerate while S3 has a much larger hole concentration. Thus, the same screening advantages may be obtained as in the metal-sheathed TFET structure 400 of FIG. 4.

In order to use the same semiconductor material for S1 and S3 as mentioned above, the thickness of S3 and diameter of S1 are carefully adjusted so that the ground-state energies line up as shown in FIG. 6. The requirements for S4 may be relaxed if the interfaces between S1 and S4 and S3 and S4 are heavily doped, in which case another embodiment may to use a metal in lieu of S4. It is even further contemplated that S3 may be replaced with a metal sheath (as in FIG. 4), so long as the work functions and band-offsets are adjusted to ensure a suitable hole concentration in S1. In yet another embodiment, S3 may be coated with an additional metal layer (not shown) to improve screening. It should also be understood that the exemplary IITE embodiments disclosed herein are equally applicable for a complementary tunneling-hole injector by replacing all p-type semiconductors with n-type semiconductors, and ensuring a suitable conduction band line up as shown in FIG. 6, but inverted.

Figure 7A:
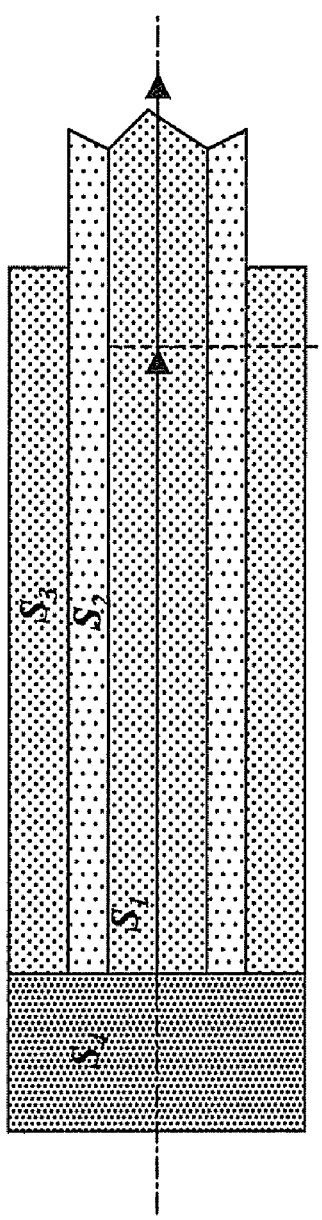
FIG. 7($a$) is another side cross-sectional view of the TFET structure of FIG. 5($a$)
Figure 7B:
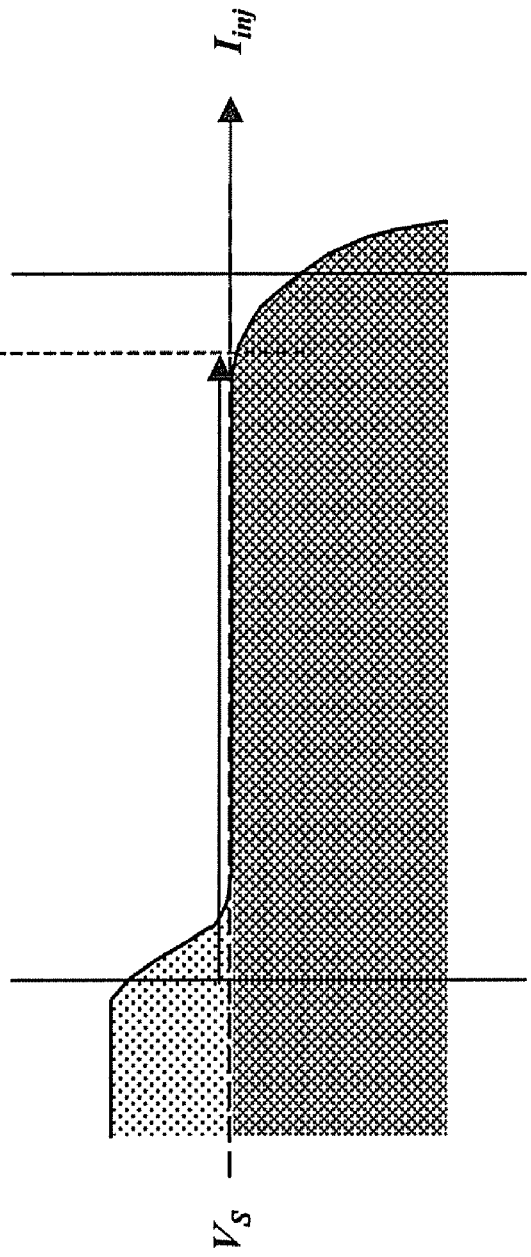

In summary, the above discussed disadvantages are addressed by the IITE embodiments. This is depicted schematically in FIGS. 7(a) and 7(b), wherein FIG. 7(a) is another side cross-sectional view of the TFET structure of FIG. 5(a), and FIG. 7(b) is a band diagram corresponding to the structure of FIG. 7(a). For one, the outer doped sheath (S3) provides longitudinal screening and reduces band-bending. Secondly, the doping-induced states and degeneracy conditions in S3 are isolated from the injector core (S1) by S2. Thirdly, the semiconductor bandgap of S3 minimizes metal induced gap states. In addition, epitaxial compatible materials S1 -S3 eliminates interface states due to a single crystal structure. The source contact layer S4 eliminates the need for an extra external contact to the sheath.

Figure 8:
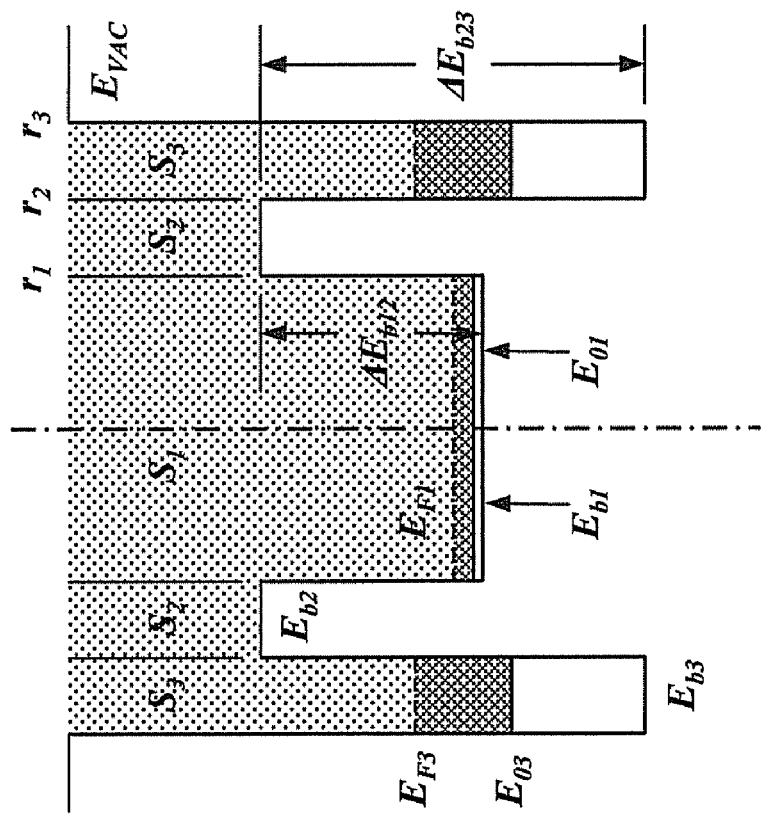
FIG. 8 is a generic band diagram of a heterojunction tunneling emitter where the bands correspond to conduction band convention and are inverted with respect to FIG. 6.

Finally, FIG. 8 is a generic band diagram 800 of a heterojunction tunneling emitter where the bands correspond to conduction band convention and are inverted with respect to FIG. 6. That is, the band diagram 800 is drawn in the radial direction and with energy of the charge carrier upwards, as is the convention for electrons in conduction bands (whereas for holes the convention is downwards, as shown in FIG. 6.

The inequalities given below apply to both electrons and holes with the understanding that "energy" may refer to either electron or hole energy for the relevant case. Here, $E_{b1}$, $E_{b2}$ and $E_{b3}$ are band-edge (conduction or valence band) energies, $E_{01}$ and $E_{03}$ are ground-state energies of the quantized sub-bands, and $E_{F1}$ and $E_{F3}$ the electron of hole Fermi energies. The diagram 800 is drawn in a flat-band condition, assuming a suitable voltage is applied between S1 and S3 and that band-bending induced by the charge itself, such as shown in FIG. 6, is neglected. In operation, S1 is shorted to S3 by S4 and the Fermi levels, thus $E_{F1}$ and $E_{F3}$ will equalize. These simplifications and approximations are shown in order to clarify the conditions on S1, S2 and S3 to facilitate operability of the exemplary embodiment(s) described. Using the vacuum level $E_{VAC}$ as a reference, the following conditions apply for the embodiments herein:

1. The band-edge energy of S2 ($E_{b2}$) is greater than those of S1 and S3 ($E_{b1}$ and $E_{b3}$), which is to say that the band discontinuities between S2 and S3 and S1 and S3 are positive.

2. The Fermi energy in S3 ($E_{F3}$) is higher than the Fermi energy in S1 ($E_{F1}$). This enables charge to flow from S3 to S1, wherein this condition may be expressed by the following equation:

$$(E_{F3}-E_{03})+(E_{03}-E_{b3})-\Delta E_{b23} > (E_{F1}-E_{01})+(E_{01}-E_{b1})-\Delta E_{b21} \quad \text{(Eq. 1)}$$

3. For a given band alignment of $E_{b3}$ and $E_{b1}$, and for given ground-state energies $E_{01}$ and $E_{03}$, the doping in S3 has to be sufficiently large to raise $E_{F3}$ above $E_{F1}$ in order to satisfy condition 2.

4. For a given band alignment of $E_{b3}$ and $E_{b1}$, and for given doping in S3, the radius $r_1$ has to be sufficiently large to decrease $E_{01}$, and the difference in radii, $r_3-r_2$ sufficiently small to increase $E_{03}$, in order to satisfy condition 2.

5. For radii $r_1$ and $r_2$, and for a given doping in S3, the band edge energy $E_{b3}$ must be sufficiently larger than $E_{b1}$, or when $E_{b1}$ is greater than $E_{b3}$ the difference must be sufficiently small, in order to satisfy condition 2. The conditions for S4 (FIG. 7(a)) are not critical. S4 must have heavy enough doping or a small enough bandgap to ensure a good ohmic contact with both S1 and S3. S1 and S3 may also be doped adjacent to S4 to ensure an ohmic contact. In this case, S4 may be a metal.

In an exemplary embodiment, suitable selected semiconductor materials are as follows: $InAs_{0.8}P_{0.2}$ for $S_1$, InP for $S_2$ and InAs for $S_3$ and for $S_4$. The radii of $S_1$, $S_2$ and $S_3$ are 30, 40 and 50 nm respectively. $S_1$ and $S_4$ are doped with silicon to a concentration of $10^{19}$ atoms/cm$^3$, ensuring a good ohmic contact of $S_3$ to $S_1$ via $S_4$ and that Eq. 1 above is satisfied. That equation becomes:

$$E_{F3}+0.033)+(-0.033+0.173)-0.6533 > (E_{F1}+0.044)+(-0.044+0.0744)-0.5544 \quad \text{(Eq. 2)}$$

This expression in turn reduces to:

$$E_{F3} > E_{F1}+0.0003 \text{ eV} \quad \text{(Eq. 3)}$$

Thus, substitution of the selected system parameters for the equation terms results in the condition, $E_{F3} > E_{F1}+0.0003$ eV, which is satisfied with the chosen doping level in $S_3$. Referring once again to FIG. 7(a), the lengths of $S_1$, $S_2$, $S_3$ and $S_4$ are not critical but should be longer than about 10 nm to allow for the band bending shown in FIG. 7(b), but also shorter than about 100 nm to minimize series resistance.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. An indirectly induced tunnel emitter for a tunneling field effect transistor (TFET) structure, comprising:
    an outer sheath that at least partially surrounds an elongated core element, the elongated core element formed from a first semiconductor material;
    an insulator layer disposed between the outer sheath and the core element;
    the outer sheath disposed at a location corresponding to a source region of the TFET structure; and
    a source contact that shorts the outer sheath to the core element;
    wherein the outer sheath is configured to introduce a carrier concentration in the source region of the core element sufficient for tunneling into a channel region of the TFET structure during an on state.

2. The TFET structure of claim 1, wherein the elongated core element comprises one or more of: a nanowire, a fin structure, and a carbon nanotube.

3. The TFET structure of claim 2, wherein the insulator layer is formed from a second semiconductor material having a wider bandgap than the first semiconductor material.

4. The TFET structure of claim 3, wherein the outer sheath comprises a metal material.

5. The TFET structure of claim 3, wherein the outer sheath comprises a outer semiconductor sheath formed from a third semiconductor material, the outer semiconductor sheath being doped at a higher concentration with respect to the core element.

6. The TFET structure of claim 5, wherein the outer sheath is coated with a metal material.

7. The TFET structure of claim 5, wherein the source contact is formed from a fourth semiconductor material that is doped at a higher concentration with respect to the core element.

8. The TFET structure of claim 7, wherein the first, second, third and fourth semiconductor materials comprise epitaxially grown semiconductors forming heterojunctions at interfaces therebetween.

9. The TFET structure of claim 8, wherein the first, third and fourth semiconductor materials are the same material.

10. The TFET structure of claim 9, wherein the first, second and third semiconductors have a single crystal structure.

11. The TFET structure of claim 7, wherein a band edge energy of the first semiconductor material is greater than a band edge energy of the second semiconductor and greater than a band edge energy of the third semiconductor material.

12. The TFET structure of claim 11, wherein a Fermi energy of the third semiconductor material is higher than a Fermi energy of the first semiconductor material.

13. The TFET structure of claim 7, wherein the first semiconductor material comprises $InAs_{0.8}P_{0.2}$, the second semiconductor material comprises InP, and the third and fourth semiconductor materials comprise InAs.

14. The TFET structure of claim 7, wherein lengths of the first, second, third and fourth semiconductor materials are from about 10 nanometers to about 100 nanometers.

15. A method of forming an indirectly induced tunnel emitter for a tunneling field effect transistor (TFET) structure, the method comprising:
    forming an elongated core element from a first semiconductor material;
    forming an insulator layer that at least partially surrounds the core element;
    forming an outer sheath that at least partially surrounds the insulator layer at a location corresponding to a source region of the TFET structure; and forming a source contact that shorts the outer sheath to the core element;

wherein the outer sheath is configured to introduce a carrier concentration in the source region of the core element sufficient for tunneling into a channel region of the TFET structure during an on state.

16. The method of claim 15, wherein the elongated core element comprises one or more of: a nanowire, a fin structure, and a carbon nanotube.

17. The method of claim 16, wherein the insulator layer is formed from a second semiconductor material having a wider bandgap than the first semiconductor material.

18. The method of claim 17, wherein the outer sheath comprises a metal material.

19. The method of claim 17, wherein the outer sheath comprises a outer semiconductor sheath formed from a third semiconductor material, the outer semiconductor sheath being doped at a higher concentration with respect to the core element.

20. The method of claim 19, wherein the outer sheath is coated with a metal material.

21. The method of claim 19, wherein the source contact is formed from a fourth semiconductor material that is doped at a higher concentration with respect to the core element.

22. The method of claim 21, wherein the first, second, third and fourth semiconductor materials comprise epitaxially grown semiconductors forming heterojunctions at interfaces therebetween.

23. The method of claim 22, wherein the first, third and fourth semiconductor materials are the same material.

24. The method of claim 23, wherein the first, second and third semiconductors have a single crystal structure.

25. The method of claim 21, wherein a band edge energy of the first semiconductor material is greater than a band edge energy of the second semiconductor and greater than a band edge energy of the third semiconductor material.

26. The method of claim 25, wherein a Fermi energy of the third semiconductor material is higher than a Fermi energy of the first semiconductor material.

27. The TFET structure of claim 21, wherein the first semiconductor material comprises $InAs_{0.8}P_{0.2}$, the second semiconductor material comprises InP, and the third and fourth semiconductor material comprise InAs.

28. The TFET structure of claim 21, wherein lengths of the first, second, third and fourth semiconductor materials are from about 10 nanometers to about 100 nanometers.

* * * * *